United States Patent
Moxham

(10) Patent No.: US 7,268,018 B2
(45) Date of Patent: Sep. 11, 2007

(54) METHOD FOR FABRICATING SEMICONDUCTOR COMPONENT WITH STIFFENER AND CIRCUIT DECAL

(75) Inventor: Stephen F. Moxham, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 165 days.

(21) Appl. No.: 11/099,372

(22) Filed: Apr. 5, 2005

(65) Prior Publication Data
US 2005/0179124 A1    Aug. 18, 2005

Related U.S. Application Data

(62) Division of application No. 10/666,302, filed on Sep. 19, 2003, now Pat. No. 7,061,085.

(51) Int. Cl.
*H01L 21/44*    (2006.01)
(52) U.S. Cl. .................................... 438/118
(58) Field of Classification Search ............... 438/478, 438/184, 193, 195–198, 200, 218, 237, 165, 438/294, 308, 337, 353, 378, 401, 6, 210, 438/104, 107–114, 118, 121–123, 128–129, 438/135, 142, 145, 149, 151, 157, 176
See application file for complete search history.

(56) References Cited

U.S. PATENT DOCUMENTS

| | | | |
|---|---|---|---|
| 5,380,681 A * | 1/1995 | Hsu .......................... 438/109 |
| 5,710,071 A | 1/1998 | Beddingfield et al. |
| 5,746,555 A * | 5/1998 | McEvoy .................... 411/14 |
| 5,757,073 A * | 5/1998 | Hoffmeyer ................ 257/700 |
| 5,760,465 A | 6/1998 | Alcoe et al. |
| 5,956,563 A * | 9/1999 | Klink et al. ................. 438/5 |
| 5,998,291 A * | 12/1999 | Bakhit et al. .............. 438/618 |
| 6,002,177 A | 12/1999 | Gaynes et al. |
| 6,020,629 A | 2/2000 | Farnworth et al. |
| 6,134,776 A * | 10/2000 | Hoffmeyer .................. 29/840 |
| 6,153,924 A | 11/2000 | Kinsman |
| 6,229,202 B1 | 5/2001 | Corisis |
| 6,229,227 B1 | 5/2001 | Muthukumaraswamy et al. |
| 6,310,390 B1 | 10/2001 | Moden |
| 6,326,242 B1 | 12/2001 | Brooks et al. |
| 6,326,244 B1 | 12/2001 | Brooks |
| 6,355,199 B1 | 3/2002 | Briar et al. |
| 6,396,141 B2 | 5/2002 | Schueller et al. |
| 6,459,144 B1 | 10/2002 | Pu et al. |

(Continued)

*Primary Examiner*—Michael Lebentritt
*Assistant Examiner*—Andre' Stevenson
(74) *Attorney, Agent, or Firm*—Stephen A. Gratton

(57) ABSTRACT

A semiconductor component includes a stiffener, a circuit decal attached to the stiffener, and a semiconductor die attached to the stiffener. The circuit decal includes conductors which function as an internal signal transmission system for the component, and a mask layer which functions as a solder mask and an outer insulating layer for the component. An adhesive layer in physical contact with the conductors attaches the circuit decal to the stiffener, and electrically insulates the conductors from the stiffener. The component also includes an area array of terminal contacts on the conductors electrically isolated by the mask layer. A method for fabricating the component includes the steps of attaching the circuit decal to the stiffener, attaching the die to the stiffener, interconnecting the die and the circuit decal, encapsulating the die, and forming the terminal contacts.

32 Claims, 8 Drawing Sheets

U.S. PATENT DOCUMENTS

| | | |
|---|---|---|
| 6,462,274 B1 | 10/2002 | Shim et al. |
| 6,465,877 B1 | 10/2002 | Farnworth et al. |
| 6,482,674 B1 | 11/2002 | Kinsman |
| 6,489,557 B2 | 12/2002 | Eskilden et al. |
| 6,506,625 B1 | 1/2003 | Moden |
| 6,506,626 B1 | 1/2003 | Chiu |
| 6,507,114 B2 | 1/2003 | Hui et al. |
| 6,509,643 B2 | 1/2003 | Ohtaka et al. |
| 6,534,848 B1 | 3/2003 | Dornbos et al. |
| 6,537,857 B2 | 3/2003 | Aquien et al. |
| 6,544,812 B1 | 4/2003 | Camenforte et al. |
| 6,552,427 B2 | 4/2003 | Moden |
| 6,611,052 B2 | 8/2003 | Poo et al. |
| 6,664,617 B2 | 12/2003 | Siu |
| 6,784,525 B2 | 8/2004 | Kuan et al. |
| 6,791,168 B1 | 9/2004 | Connell et al. |
| 6,825,569 B2 | 11/2004 | Jiang et al. |
| 6,835,599 B2 | 12/2004 | Kuan et al. |
| 6,838,754 B2 | 1/2005 | Kim |
| 6,841,883 B1 | 1/2005 | Farnworth et al. |
| 6,853,064 B2 | 2/2005 | Bolken et al. |
| 6,858,467 B2 | 2/2005 | Moden |
| 7,061,085 B2 | 6/2006 | Moxham |
| 7,115,982 B2 | 10/2006 | Moxham |
| 2003/0064547 A1 | 4/2003 | Akram et al. |
| 2003/0102567 A1 | 6/2003 | Eskilden |
| 2005/0073035 A1* | 4/2005 | Moxham .................... 257/678 |
| 2005/0179143 A1* | 8/2005 | Moxham .................... 257/782 |

* cited by examiner

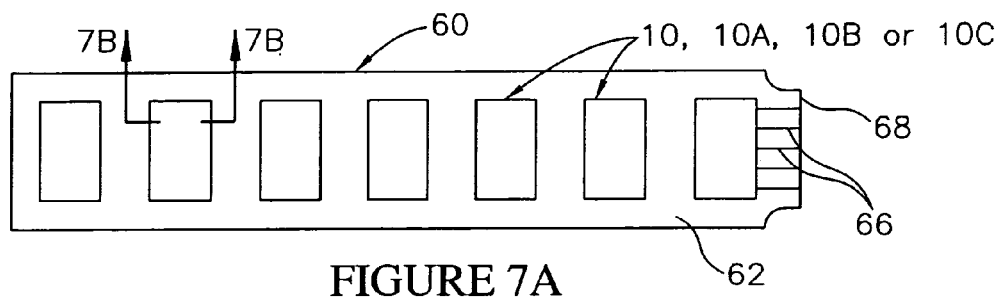
FIGURE 7A
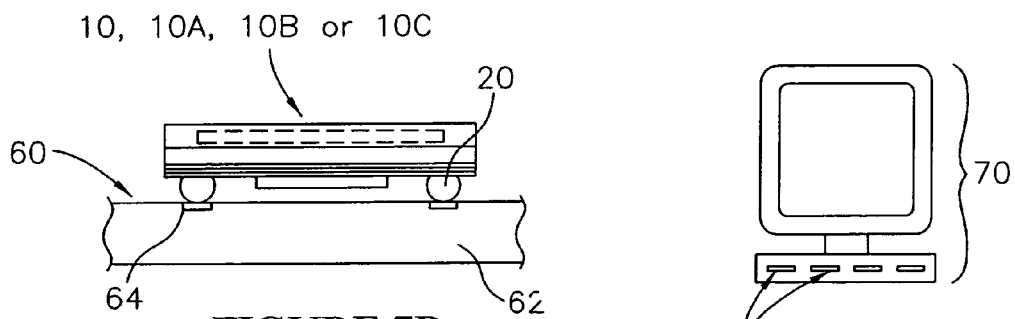
FIGURE 7B
FIGURE 8
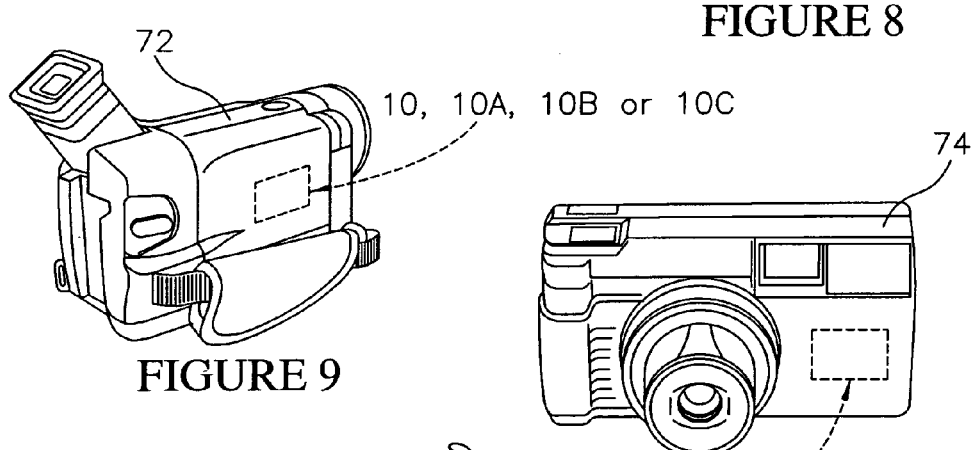
FIGURE 9
FIGURE 10
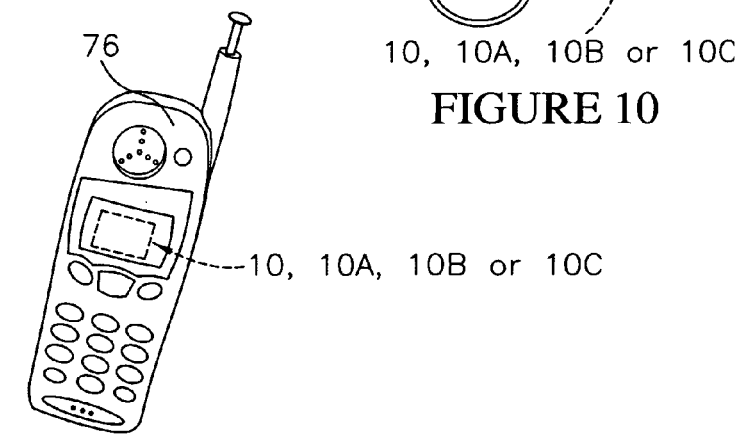
FIGURE 11

METHOD FOR FABRICATING SEMICONDUCTOR COMPONENT WITH STIFFENER AND CIRCUIT DECAL

CROSS REFERENCE TO RELATED APPLICATIONS

This application is a division of Ser. No. 10/666,302 filed Sep. 19, 2003, U.S. Pat. No. 7,061,085. This application is related to Ser. No. 11/099,374, U.S. Pat. No. 7,115,982, and to Ser. No. 11/434,475 filed May 15, 2006.

FIELD OF THE INVENTION

This invention relates generally to semiconductor manufacture and packaging. More particularly, this invention relates to a semiconductor component having a stiffener and a circuit decal, to a method for fabricating the component, and to systems incorporating the component.

BACKGROUND OF THE INVENTION

Semiconductor components, such as BGA packages, can include a flexible circuit element, such as TAB tape (tape automated bonding tape). The flexible circuit includes a polymer substrate, such as polyimide tape, and metal circuitry on the polymer substrate. The metal circuitry includes conductors which provide an internal signal transmission system for the component. In addition, the metal circuitry can include contacts for wire bonding the conductors to the die contained in the component, and for attaching terminal contacts, such as solder bumps or balls, to the conductors.

Because the flexible circuit has no structural rigidity, the component can also include a stiffener, and the flexible circuit can be attached to the stiffener. The stiffener can comprise a metal sheet, or an organic polymer, such as a circuit board material. In addition, an adhesive layer can be used to attach the polymer substrate of the flexible circuit to the stiffener.

In general, components with stiffeners are relatively complicated and expensive to manufacture. It would be desirable to simplify the construction of semiconductor components that utilize a stiffener and a flexible circuit on the stiffener. The present invention is directed to a semiconductor component having a stiffener, but with a simplified construction that employs a circuit decal attached directly to the stiffener.

SUMMARY OF THE INVENTION

In accordance with the present invention, an improved semiconductor component, a method for fabricating the component, and electronic systems incorporating the component are provided.

The component includes a stiffener and a circuit decal attached to the stiffener. The component also includes a semiconductor die attached to the stiffener in a board on chip configuration (BOC), and wire interconnects in electrical communication with the die and the circuit decal. The circuit decal does not include a polymer substrate as with a conventional flexible circuit, but includes a pattern of metal conductors having contacts in an area array, and a polymer mask layer on the conductors. In addition, an adhesive layer attaches the circuit decal to the stiffener, and electrically insulates the conductors from the stiffener. The component also can also include terminal contacts on the contacts electrically isolated by the mask layer, a die encapsulant encapsulating the die, and an interconnect encapsulant encapsulating the wire interconnects.

An alternate embodiment component includes a stiffener having circuit decals on opposing sides thereof, and a semiconductor die back bonded and interconnected to the stiffener in a chip on board (COB) configuration. A first circuit decal includes first conductors and first contacts for terminal contacts for the component. A second circuit decal includes second conductors and second contacts for interconnecting the die. The stiffener also includes conductive vias which electrically connect selected first conductors on the first circuit decal, to selected second conductors on the second circuit decal.

Another alternate embodiment component includes a stiffener having circuit decals on opposing sides thereof, and a pair of stacked dice attached to the stiffener. A first die (outer die) is back bonded to a second die (inner die) and is interconnected to a first circuit decal on the stiffener. In addition, the second die is back bonded to the first circuit decal, and is interconnected to the second circuit decal. The stiffener also includes conductive vias which electrically connect selected conductors on the first circuit decal to selected conductors on the second circuit decal. The first circuit decal also includes first contacts for interconnecting the first die. The second circuit decal includes second contacts for interconnecting the second die, and third contacts for terminal contacts for the component.

A method for fabricating the component includes the steps of providing the stiffener, providing the circuit decal, and attaching the circuit decal to the stiffener. The method also includes the steps of attaching the die to the stiffener, interconnecting the die and the circuit decal, encapsulating the die, and forming the terminal contacts.

In an illustrative embodiment, the component comprises a ball grid array (BGA) semiconductor package. In an alternate embodiment the component comprises a semiconductor module.

The component can be used to construct electronic systems such as modules, computers, cameras, camcorders and cell phones.

BRIEF DESCRIPTION OF THE DRAWINGS

FIG. 7A is a schematic plan view of a module system incorporating one or more components constructed in accordance with the invention;

FIG. 7B is a schematic cross sectional view of the module system taken along line 7B-7B of FIG. 7A;

FIG. 8 is a schematic cross sectional view of a computer system incorporating one or more components constructed in accordance with the invention;

FIG. 9 is a schematic cross sectional view of a camcorder system incorporating one or more components constructed in accordance with the invention;

FIG. 10 is a schematic cross sectional view of a camera system incorporating one or more components constructed in accordance with the invention; and FIG. 11 is a schematic cross sectional view of a cellular phone system incorporating one or more components constructed in accordance with the invention.

DETAILED DESCRIPTION OF THE PREFERRED EMBODIMENTS

Figures 1A, 1B:
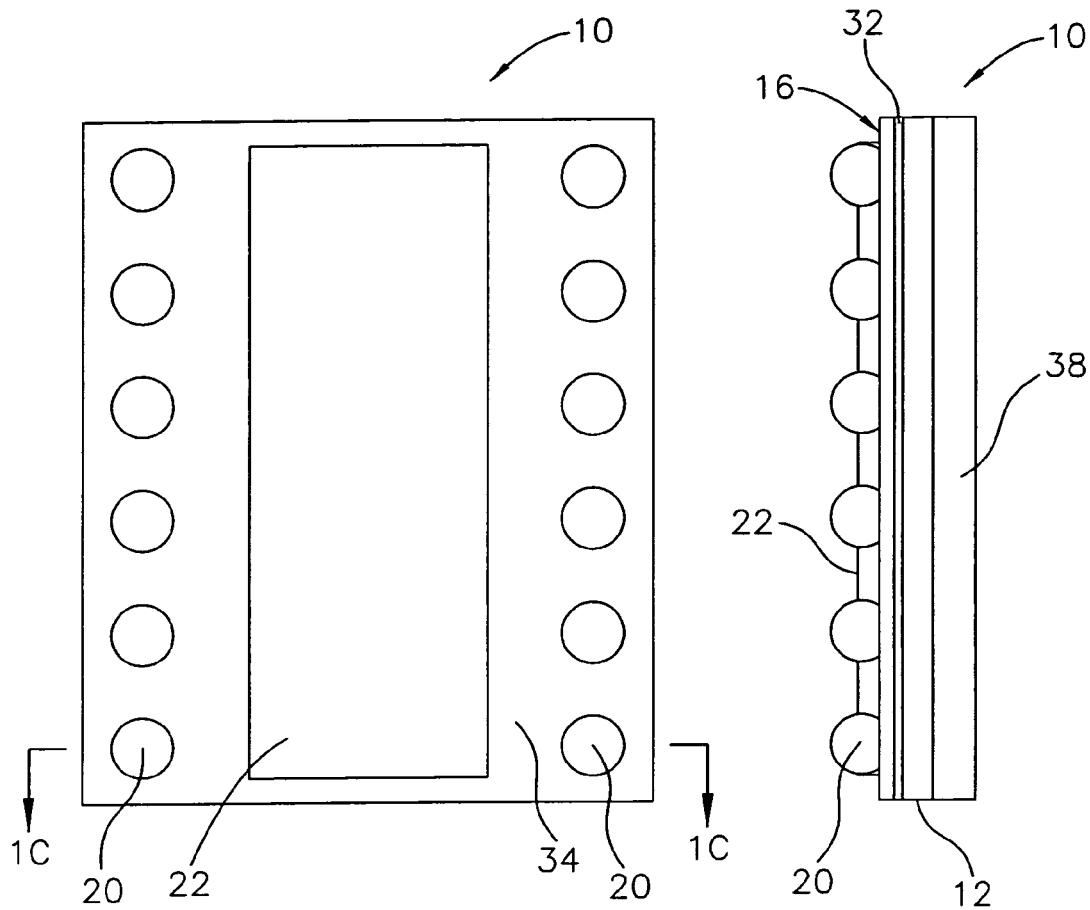
FIG. 1A is an enlarged schematic bottom view of a semiconductor component constructed in accordance with the invention having a board on chip (BOC) configuration.
FIG. 1B is an enlarged schematic side elevation view of the component.

Referring to FIGS. 1A-1E, a semiconductor component 10 constructed in accordance with the invention is illustrated. As used herein, the term "semiconductor component" refers to an electronic element that includes a semiconductor die. Exemplary semiconductor components include semiconductor dice, semiconductor modules, and semiconductor packages, such as BGA (ball grid array), FBGA (fine ball grid array), EFBGA (enhanced fine ball grid array), and chip scale packages.

In the illustrative embodiment, the component 10 comprises a BGA package having a board on chip (BOC) configuration. As shown in FIG. 1C, the component 10 includes a stiffener 12, a semiconductor die 14 attached circuit side down to the stiffener 12, and a circuit decal 16 attached to the stiffener 12. The component 10 also includes wire interconnects 18 wire bonded to the die 14 and to the circuit decal 16, and an interconnect encapsulant 22 encapsulating the wire interconnects 18. The component 10 also includes an array of terminal contacts 20 attached to the circuit decal 16, and a die encapsulant 38 encapsulating the die 14 and the stiffener 12.

The die 14 can comprise a conventional semiconductor die having active semiconductor devices arranged in a desired electrical configuration. For example, the die 14 can comprise a high speed digital logic device, such as a dynamic random access memory (DRAM), a static random access memory (SRAM), a flash memory, a microprocessor, a digital signal processor (DSP), or an application specific integrated circuit (ASIC). In addition, the die 14 can comprise a tested die, that has been certified as a known good die.

In the illustrative embodiment, the die 14 is generally rectangular shaped with opposed lateral edges and opposed longitudinal edges. However, the die 14 can have any polygonal shape, such as square or triangular, and can also have a circular or oval shape. As shown in FIG. 1C, the die 14 can be mounted to the stiffener 12 in a board on chip configuration. As used herein, the term board on chip means a circuit side 26 of the die 14 is attached to the stiffener 12.

Figure 1C:
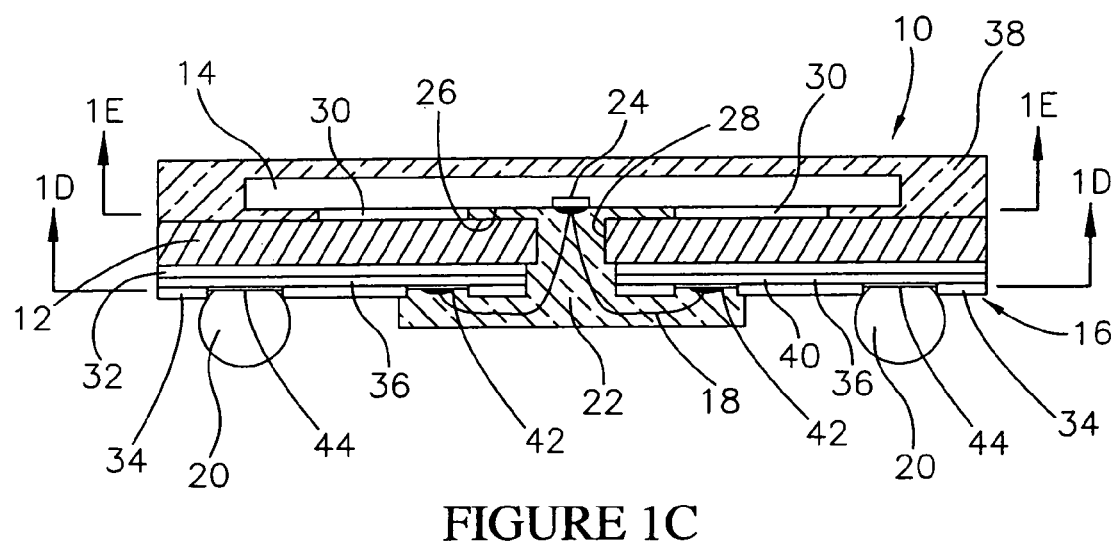
FIG. 1C is an enlarged schematic cross sectional view of the component taken along line 1C-1C of FIG. 1A.

The die 14 also includes a pattern of die contacts 24 on the circuit side 26 in electrical communication with the integrated circuits contained on the die 14. As shown in FIG. 1E, the die contacts 24 are square pads arranged in a single row proximate to a center line of the die 14. However, this arrangement is merely exemplary, and the die contacts 24 can have any desired shape (e.g., round, rectangular) in any pattern. In the illustrative embodiment, the die contacts 24 align with a wire bonding opening 28 in the stiffener 12, which allows the wire interconnects 18 to be placed through the stiffener 12, and wire bonded to the die contacts 24 and to the circuit decal 16. The die contacts 24 can comprise the device bond pads, or alternately redistribution pads, in electrical communication with the integrated circuits contained on the die 14. Further, the die contacts 24 can comprise one or more layers of metal, and preferably include a wire bondable outer layer, such as Al, Au, Cu, or alloys of these metals.

As shown in FIG. 1C, the component 10 also includes adhesive members 30 configured to attach the circuit side 26 of the die 14 to the stiffener 12. The adhesive members 30 can comprise an electrically insulating polymer tape material, such as a polyimide tape, having an adhesive material on one or both sides (e.g., "KAPTON" tape manufactured by DuPont). The adhesive members 30 can also comprise a curable die attach polymer, such as an epoxy, an acrylic, or a polyimide material. In the illustrative embodiment there are two spaced, generally rectangular shaped adhesive members 30 located proximate to longitudinal peripheral edges of the die 14. However, this arrangement is merely exemplary and other arrangements, such as one or more rows of adhesive dots can be employed.

The stiffener 12 comprises a rigid material able to resist bending and deformation, and provide a rigidifying structure for the component 10. In the illustrative embodiment, the stiffener 12 comprises a metal sheet formed of a metal, such as stainless steel (e.g., "ALLOY 42"), copper, nickel, titanium, aluminum, and alloys of these metals. Rather than metal, the stiffener 12 can comprise another rigid material such as ceramic, plastic or silicon. The stiffener 12 can also comprise a reinforced polymer laminate material, such as bismaleimide triazine (BT), or a polyimide resin.

A thickness of the stiffener 12 can be selected as required, with from 4 mils to 10 mils being representative for a metal sheet. Similarly, a size and peripheral outline of the stiffener 12 can be selected as required. In the illustrative embodiment, the stiffener 12 is generally rectangular in shape, and has a peripheral outline corresponding to, but slightly larger than (e.g., 1.25×) the outline of the die 14. The stiffener 12 includes the wire bonding opening 28, which as shown in FIG. 1D, is generally rectangular in shape, and extends completely through the thickness of the stiffener 12.

As shown in FIG. 1C, the component 10 also includes an adhesive layer 32, which attaches the circuit decal 16 to the stiffener 12. The adhesive layer 32 can comprise an electrically insulating polymer, such as a curable epoxy, acrylic, or polyimide material. The adhesive layer 32 can also comprise a polymer tape material having an adhesive material on one or both sides. In addition to performing the function of attaching the circuit decal 16 to the stiffener 12, the adhesive layer 32 also performs the function of electrically insulating the circuit decal 16 from the stiffener 12.

As shown in FIG. 1C, the circuit decal 16 includes a mask layer 34 and a metallization layer 36. The mask layer 34 functions as a solder mask for the terminal contacts 20, an outer electrically insulating layer for the conductors 40 and the component 10, and a support structure for the metallization layer 36 and the circuit decal 16. The metallization layer 36 functions as an internal signal transmission system for the component 10 and a structure for wire bonding and forming the terminal contacts 20.

Figure 1D:
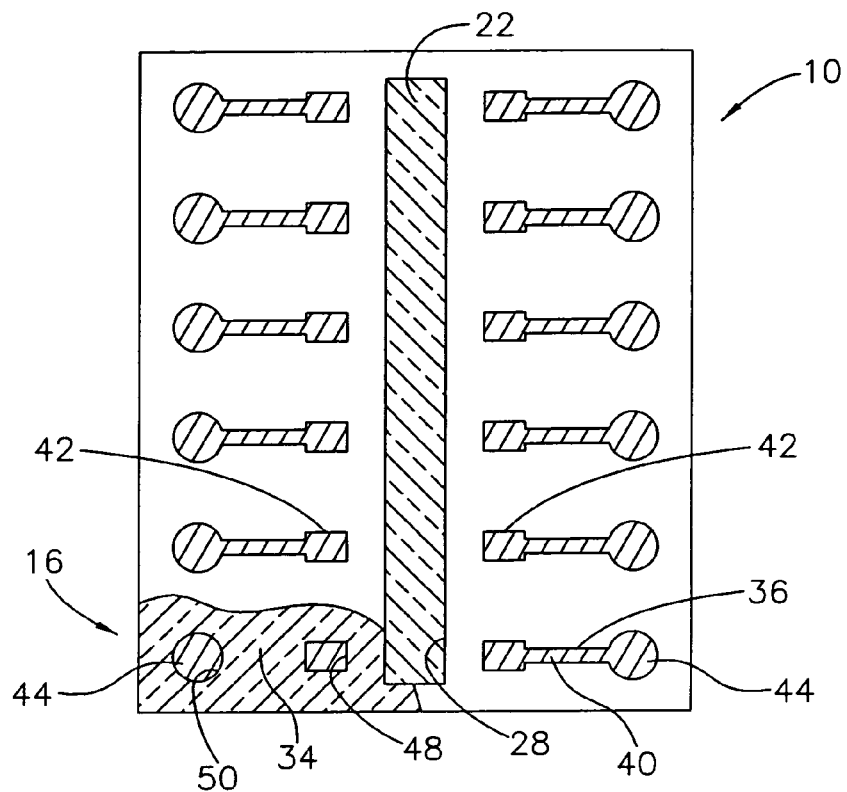
FIG. 1D is an enlarged schematic cross sectional view, partially cut away, of the component taken along line 1D-1D of FIG. 1C.
Figure 1E:
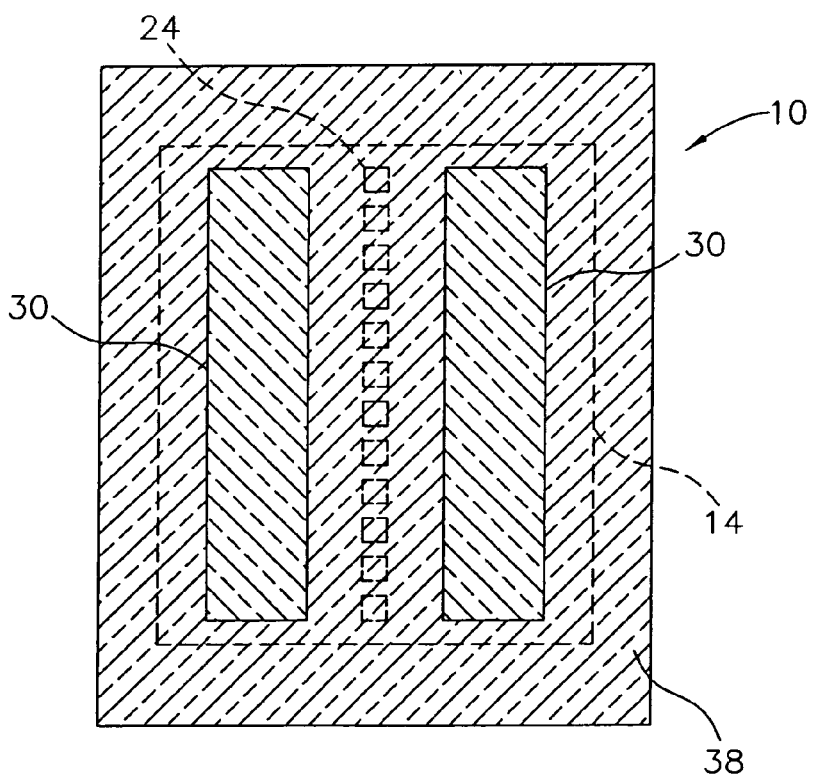
FIG. 1E is an enlarged schematic cross sectional view of the component taken along line 1E-1E of FIG. 1C.

As shown in FIG. 1D, the metallization layer 36 includes a pattern of conductors 40 having interconnect contacts 42 on first ends thereof, and terminal contact contacts 44 on second opposing ends thereof. The interconnect contacts 42 function as bonding sites for bonding the wire interconnects 18 to the circuit decal 16. The terminal contact contacts 44 function as bonding sites for bonding or forming the terminal contacts 20 for the component 10.

As shown in FIG. 1D, the circuit decal 16 can have a peripheral outline that matches the peripheral outline of the stiffener 12. The mask layer 34 also has this same peripheral outline, and includes a wire bonding opening 46 that aligns with the wire bonding opening 28 on the stiffener 12. Alternately, the circuit decal 16, the stiffener 12 and the mask layer 34 can all have a different peripheral outline.

The mask layer 34 also includes interconnect openings 48 that align with the interconnect contacts 42, and terminal contact openings 50 that align with the terminal contact contacts 44. In the illustrative embodiment the interconnect openings 48 and the interconnect contacts 42 have substantially similar peripheral outlines, but these outlines can also be different. Similarly, the terminal contact openings 50 and the terminal contact contacts 44 have substantially similar peripheral outlines, but these outlines can also be different.

The mask layer 34 also forms an outside, or backside surface, of component 10, and faces away from the stiffener 12, separated from the stiffener 12 by the adhesive layer 32. The mask layer 34 comprises an electrically insulating, low surface tension material, which prevents bridging and shorting between the terminal contacts 20 in the component 10. In addition, the interconnect openings 48 (FIG. 1D) on the mask layer 34 help to position the terminal contacts 20 on the terminal contact contacts 44 on the circuit decal 16 during forming of the terminal contacts 20.

As shown in FIG. 1D, the conductors 40 on the metallization layer 36 can be formed in a required circuit pattern. The simple pattern shown in FIG. 1D is merely illustrative, as the conductors 40 can be formed in any circuit pattern. By way of example, the metallization layer 36 can comprise a sheet of copper having a thickness of from 30 µm to 40 µm, which has been etched, or otherwise patterned, to form the conductors 40, the interconnect contacts 42, and the terminal contact contacts 44. In addition, the interconnect contacts 42 and the terminal contact contacts 44 can include additional outer metal layers such as Au, Ni, Pd and alloys thereof, configured to facilitate bonding of the wire interconnects 18 and the terminal contacts 20.

As shown in FIG. 1C, the wire interconnects 18 comprise metal wires bonded to the die contacts 24 and to the interconnect contacts 42. The wire interconnects 18 can comprise a material such as Au, Al, or alloys thereof, such as AlMG or AuSi. The wire interconnects 18 can be bonded to the die contacts 24 and to the interconnect contacts 42 using a conventional wire bonder. Alternately other interconnects, such as beam leads or TAB tape, can be used in place of the wire interconnects 18.

As shown in FIG. 1E, the die encapsulant 38 has a peripheral outline that matches the peripheral outline of the stiffener 12. The die encapsulant 38 also forms a body of the component 10, and a large portion of the exterior of the component 10. The die encapsulant 38 can comprise a curable polymer material such as an epoxy, a silicone, a polyimide or a transfer molded underfill compound (MUF). In addition, these polymer materials can include fillers, such as silicates, configured to reduce the coefficient of thermal expansion (CTE) and adjust the viscosity of the polymer material. The die encapsulant 38 can alternately comprise a photo imageable material, such as a resist, which can be patterned using a photolithography process. As another alternative, the die encapsulant 38 can comprise a laser imageable material, which can be patterned using a stereographic lithography process.

As shown in FIG. 1C, the interconnect encapsulant 22 extends into the wire bonding opening 28 on the stiffener 12, and encapsulates the wire bonds on the die contacts 24. In addition, the interconnect encapsulant 22 encapsulates the wire bonds on the interconnect contacts 42, and an inner portion of the circuit decal 16. The interconnect encapsulant 22 can comprise a same material as the die encapsulant 38, or can comprise a different material. As another alternative, the interconnect encapsulant 22 can comprise a glob top material formed in a desired shape using a material dispensing system having a deposition nozzle. One suitable system is manufactured by Asymtek of Carlsbad, Calif.

As shown in FIG. 1A, the terminal contacts 20 are formed on the terminal contact contacts 44, which are configured in an area array. As shown in FIG. 1D, the pattern of the terminal contact contacts 44 determines the pattern of the terminal contacts 20. The terminal contacts 20 are also sometimes referred to in the art as outer lead bonds (OLB). In the illustrative embodiment, the terminal contacts 20 comprise metal or solder bumps or balls bonded to the terminal contact contacts 44. However, the terminal contacts 20 can also comprise pins, polymer bumps, spring contacts or any terminal contact or outer lead bond (OLB) known in the art. Also in the illustrative embodiment, there are twelve terminal contacts 20, arranged in a grid array (BGA). However, this arrangement is merely exemplary, and the terminal contacts 20 can be arranged in any area array, such as a fine ball grid array (FBGA), an enhanced fine ball grid array (EFBGA), or a peripheral array, containing any desired number of terminal contacts 20.

Further, in the illustrative embodiment, the terminal contacts 20 have outside diameters on the order of about 300 µm to 350 µm. This makes the terminal contacts 20 much larger in comparison to the other elements of the component 10. However, for illustrative purposes the terminal contacts 20 are shown as being about the same size as other elements of the component 10.

Figure 2A:
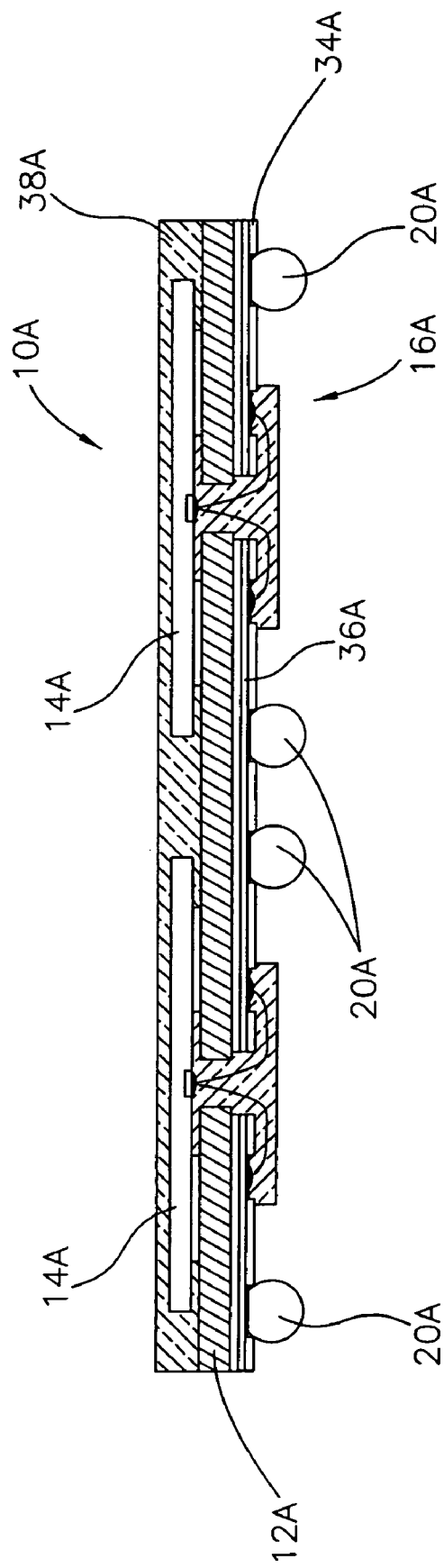
FIG. 2A is an enlarged schematic cross sectional view, similar to FIG. 1C, of an alternate embodiment component containing multiple semiconductor dice located along a common plane.

Referring to FIG. 2A, an alternate embodiment component 10A is substantially identical to the component 10 (FIG. 1C) but includes multiple semiconductor dice 14A. In the illustrative embodiment, there are two dice 14A, but the component 10A can include any number of dice 14A. Also, if desired, each die 14A can have a different electrical configuration (e.g., memory vs. processing), such that the component 10A can be configured as a module, or as a system in a package (SIP). The component 10A includes a stiffener 12A configured to support the dice 14A, with each die 14A in a board on chip configuration. The component 10A also includes a circuit decal 16A configured to provide an internal signal transmission for the dice 14A. The circuit decal 16A includes a metallization layer 36A, and a mask layer 34A, constructed substantially as previously described for the circuit decal 16 and the mask layer 36 for the component 10. The component 10A also includes terminal contacts 20A on the circuit decal 16A, and a die encapsulant 38A which encapsulates the dice 14A and a major surface of the stiffener 12A.

Figure 2B:
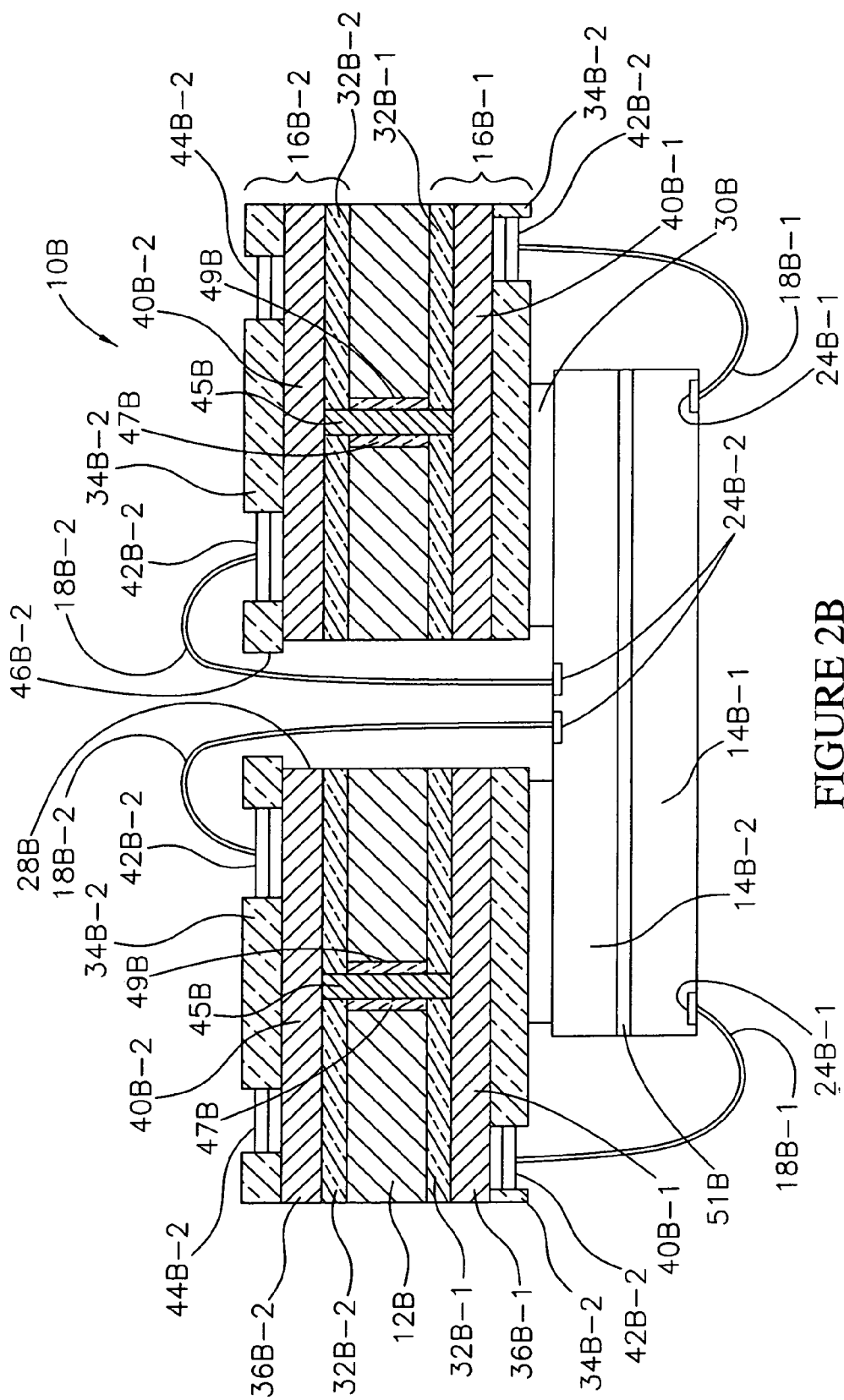
FIG. 2B is an enlarged schematic cross sectional view, similar to FIG. 1C, of an alternate embodiment component containing multiple semiconductor dice in a stacked configuration.

Referring to FIG. 2B, an alternate embodiment component 10B includes a pair of stacked dice 14B-1, 14B-2. Each die 14B-1, 14B-2 includes a plurality of die contacts 24B-1, 24B-2 formed on the circuit side thereof in electrical communication with the integrated circuits thereon. In addition, the dice 14B-1, 14B-2 are bonded back to back using an adhesive layer 51B, such as a curable polymer adhesive or a polymer tape formed between the dice 14B-1, 14B-2. Further, the component 10B can include a die encapsulant, which for simplicity is not shown, but which can be constructed substantially as previously described for the die encapsulant 38 (FIG. 1C).

The component 10B also includes a stiffener 12B having a first circuit decal 16B-1 on a first side thereof, and a second circuit decal 16B-2 on an opposing second side thereof. Each circuit decal 16B-1, 16B-2 is constructed substantially as previously described for the circuit decal 16 (FIG. 1C). Each circuit decal 16B-1 or 16B-2 includes a mask layer 34B-1 or 34B-2, and a metallization layer 36B-1 or 36B-2 which comprise a plurality of conductors 40B-1 or 40B-2. In addition, adhesive layers 32B-1, 32B-2 attach the circuit decals 16B-1, 16B-2 to the opposing sides of the stiffener 12B.

The first circuit decal 16B-1 includes a plurality of interconnect contacts 42B-1 (first contacts) in electrical communication with the conductors 40B-1 thereon. The interconnect contacts 42B-2 are constructed substantially as previously described for the interconnect contacts 42 (FIG. 1C). The interconnect contacts 42B-1 are bonded to wire interconnects 18B-1 that are also bonded to the die contacts 24B-1 on the first die 14B-1.

The second circuit decal 16B-2 includes a plurality of interconnect contacts 42B-2 (second contacts) in electrical communication with the conductors 40B-2 thereon. The interconnect contacts 42B-2 are bonded to wire interconnects 18B-2 that are also bonded to the die contacts 24B-2 on the second die 14B-2. The second circuit decal 16B-2 also includes a wire bonding opening 46B-2 which provides access for the wire interconnects 18B-2.

The second circuit decal 16B-2 also includes a plurality of terminal contact contacts 44B-2 (third contacts) in electrical communication with the conductors 40B-2 thereon. The terminal contact contacts 44B-2 can be constructed substantially as previously described for the terminal contact contacts 44 (FIG. 1C). The component 10B can also include terminal contacts (not shown) on the terminal contact contacts 44B-2, which for simplicity are not shown, but can be constructed substantially as previously described for the terminal contacts 20 (FIG. 1C).

The stiffener 12B for the component 10B is constructed substantially as previously described for the stiffener 12 (FIG. 1C). The stiffener 12B includes a wire bonding opening 28B which provides access through the stiffener 12B for the wire interconnects 18B-2. The stiffener 12B also includes a plurality of conductive vias 45B, which electrically connect selected conductors 40B-1 on the first circuit decal 16B-1 to selected conductors 40B-2 on the second circuit decal 16B-2. The conductive vias 45B comprise openings 49B through the stiffener 12B at least partially filled with a conductive material, such as a metal or a conductive polymer. In addition, if the stiffener 12B comprises a conductive material such as a metal, the conductive vias 45B also include insulating layers 47B, such as an electrically insulating polymer deposited within the openings 49B. If the stiffener comprises an electrically insulating material, such as ceramic or plastic, the insulating layers 47B are not required. The conductive vias 45B can also extend through the adhesive layers 36B-1, 36B-2, such that physical and electrical contact is made with the selected conductors 40B-1, 40B-2.

Figure 2C:
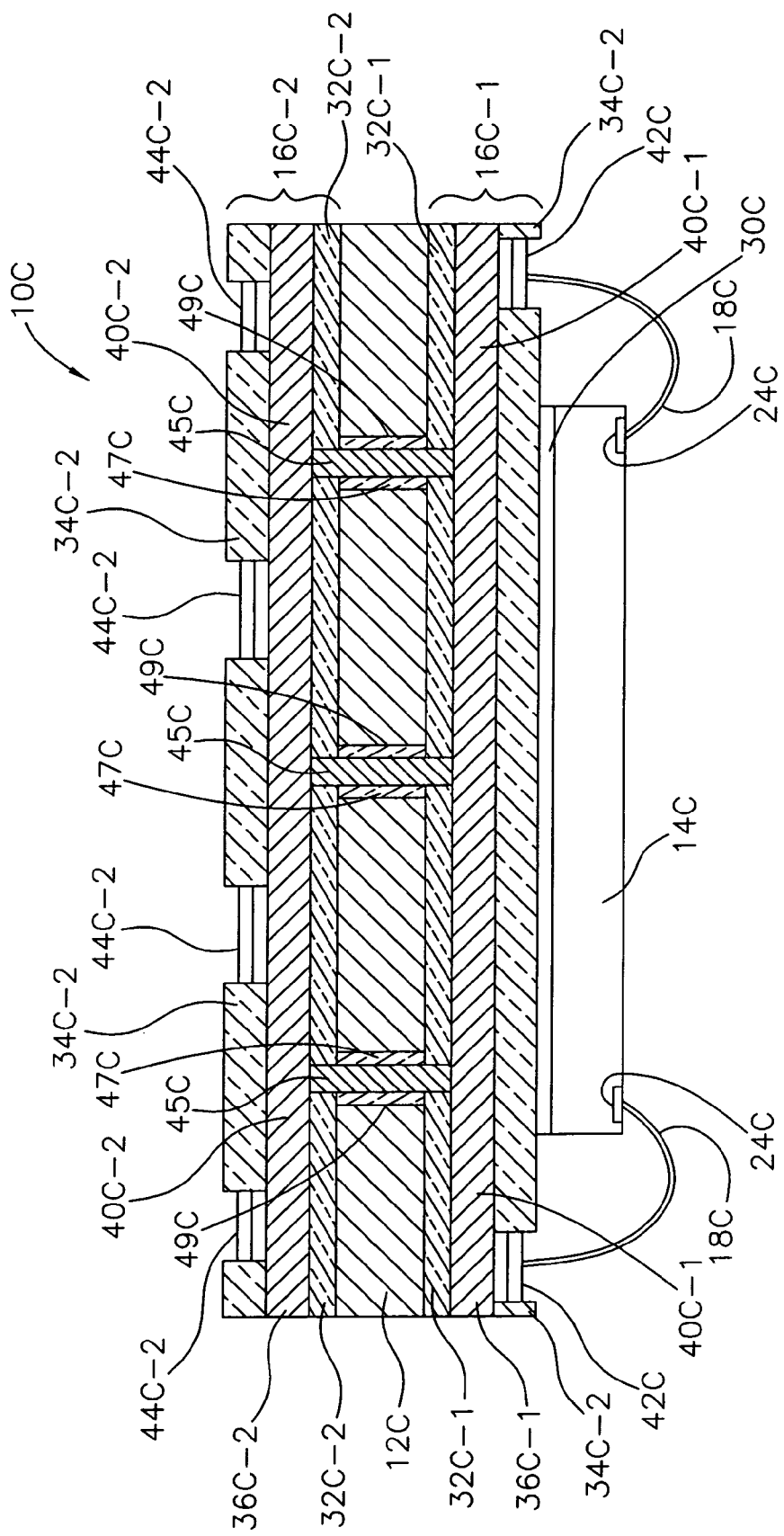
FIG. 2C is an enlarged schematic cross sectional view, similar to FIG. 1C, of an alternate embodiment component having a chip on board (COB) configuration.

Referring to FIG. 2C, an alternate embodiment component 10C includes a semiconductor die 14C back bonded and wire bonded to a stiffener 12C in a chip on board (COB) configuration. The die 14C includes a plurality of die contacts 24C formed on the circuit side thereof in electrical communication with the integrated circuits thereon. In addition, a back side of the die 14C is bonded to the stiffener 12C using an adhesive layer 30C. Further, the component 10C can include a die encapsulant, which for simplicity is not shown, but which can be constructed substantially as previously described for the die encapsulant 38 (FIG. 1C).

The component 10C also includes a first circuit decal 16C-1 on a first side of the stiffener 12C, and a second circuit decal 16C-2 on an opposing second side of the stiffener 12C. Each circuit decal 16C-1, 16C-2 is constructed substantially as previously described for the circuit decal 16 (FIG. 1C). Each circuit decal 16C-1 or 16C-2 includes a mask layer 34C-1 or 34C-2, and a metallization layer 36C-1 or 36C-2 which comprise a plurality of conductors 40C-1 or 40C-2. In addition, adhesive layers 32C-1, 32C-2 attach the circuit decals 16C-1, 16C-2 to the opposing sides of the stiffener 12C.

The first circuit decal 16C-1 includes a plurality of interconnect contacts 42C-1 (first contacts) in electrical communication with the conductors 40C-1 thereon. The interconnect contacts 42C-2 are constructed substantially as previously described for the interconnect contacts 42 (FIG. 1C). The interconnect contacts 42C-1 are bonded to wire interconnects 18C that are also bonded to the die contacts 24C on the die 14C.

The second circuit decal 16C-2 includes a plurality of terminal contact contacts 44C-2 (second contacts) in electrical communication with the conductors 40C-2 thereon. The terminal contact contacts 44C-2 can be constructed substantially as previously described for the terminal contact contacts 44 (FIG. 1C). The component 10B can also include terminal contacts (not shown) on the terminal contact contacts 44C-2, which for simplicity are not shown, but can be constructed substantially as previously described for the terminal contacts 20 (FIG. 1C).

The stiffener 12C for the component 10C is constructed substantially as previously described for the stiffener 12 (FIG. 1C). However, the stiffener 12C includes a plurality of conductive vias 45C, which electrically connect selected conductors 40C-1 on the first circuit decal 16C-1 to selected conductors 40C-2 on the second circuit decal 16C-2. The conductive vias 45C comprise openings 49C through the stiffener 12C at least partially filled with a conductive material, such as a metal or a conductive polymer. In addition, if the stiffener 12C comprises a conductive material such as a metal, the conductive vias 45C also include insulating layers 47C, such as an electrically insulating polymer deposited within the openings 49C. If the stiffener comprises an electrically insulating material, such as ceramic or plastic, the insulating layers 47C are not required. The conductive vias 45C can also extend through the adhesive layers 36C-1, 36C-2, such that physical and electrical contact is made with the selected conductors 40C-1, 40C-2.

Figure 3:
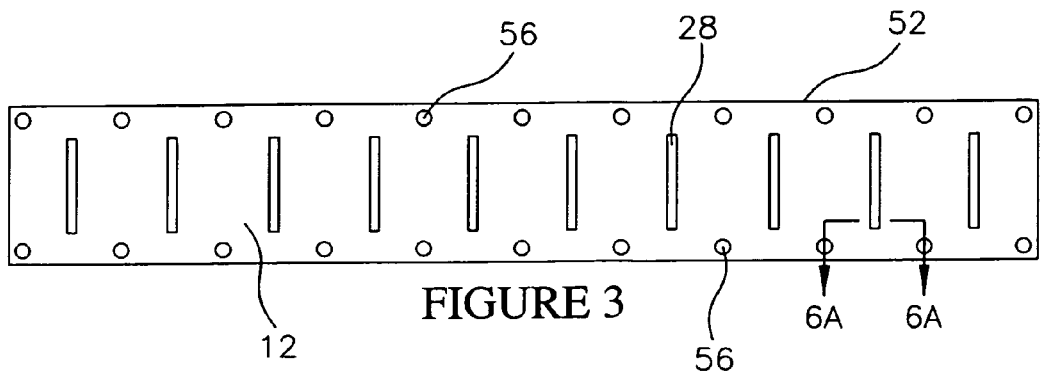
FIG. 3 is a schematic plan view of a stiffener strip containing multiple stiffeners for constructing multiple components.

Referring to FIGS. 3, 4A-4B and 5, elements used in a method for fabricating the semiconductor component 10 are illustrated. As shown in FIG. 3, during the fabrication method, the stiffener 12 can be contained on a stiffener strip 52, which is similar in construction to a metal leadframe. The stiffener strip 52 includes a plurality of stiffeners 12, which will subsequently be combined with circuit decals 16, and singulated into individual components 10. The stiffener strip 52 also includes indexing openings 56 along its peripheral edges, which allow handling by automated equipment such as tracks, die attachers, wire bonders and molding machinery. In the illustrative embodiment, the stiffener strip 52 is generally rectangular in shape and includes ten stiffeners 12. However, this arrangement is merely exemplary and the stiffener strip 52 can contain any number of stiffeners 12. Each stiffener 12 includes a wire bonding opening 28 substantially as previously described. Also in the illustrative embodiment, the stiffener strip 52 comprises a metal sheet having a thickness of from 4 mils to 10 mils. Suitable metals for the stiffener strip 52 and the stiffeners 12 include stainless steel (e.g., "ALLOY 42"), copper, nickel, titanium, aluminum and alloys of these metals. In addition, the stiffener strip 52 can be made using techniques that are known in the art, such as stamping and etching.

Figure 4A:
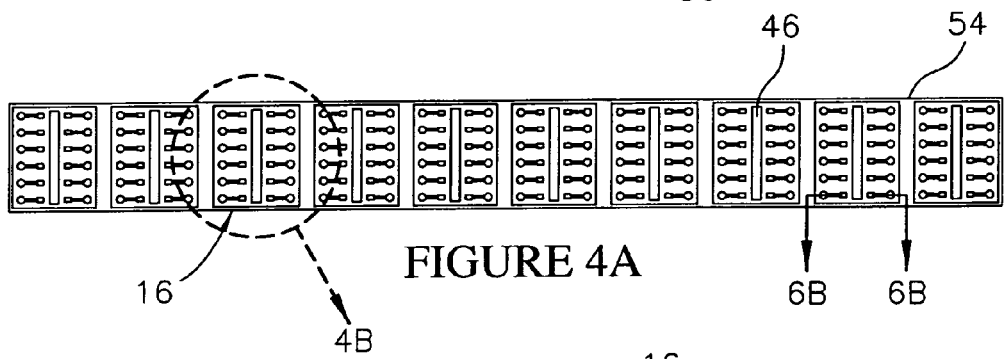
FIG. 4A is a schematic plan view of a decal strip containing multiple circuit decals for constructing multiple components.
Figure 4B:
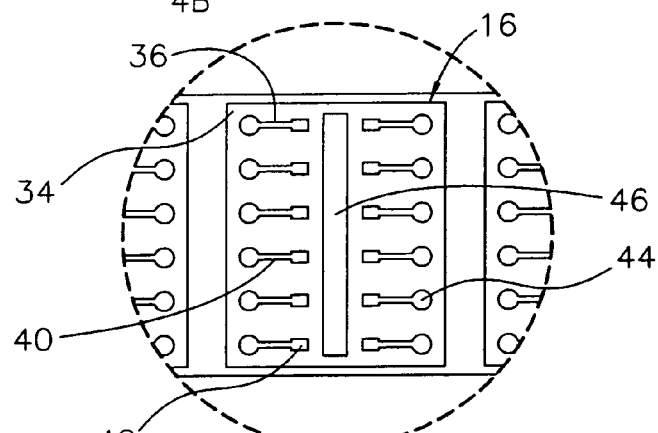
FIG. 4B is an enlarged view taken along line 4B of FIG. 4A illustrating a single circuit decal on the decal strip.

As shown in FIGS. 4A and 4B, the circuit decal 16 can be contained on a decal strip 54. The decal strip 16 includes a plurality of separate circuit decals 16, which will be combined with the stiffeners 12, and singulated into individual components 10. The decal strip 54 is similar in construction to a multi layered tape such as TAB tape, but does not include a polymer substrate. Each circuit decal 16 has two layers, which include the metallization layer 36 and the mask layer 34. The metallization layer 36 includes the conductors 40, the interconnect contacts 42, and the terminal contact contacts 44, substantially as previously described. The mask layer 34 includes the terminal contact openings 50 (FIG. 1D), the interconnect openings 48 (FIG. 1D), and the wire bonding openings 46 substantially as previously described.

The mask layer 34 can comprise a photoimageable material, that can be formed on the metallization layer 36 with a required peripheral outline, exposed through a mask, developed and then cured. Exposure and development of the mask layer 34 forms the interconnect openings 50 for the interconnect contacts 42, and the terminal contact openings 50 for the terminal contact contacts 44, in a required pattern and with required diameters. In addition, exposure and development of the mask layer 34 forms the wire bonding opening 46.

By way of example, the mask layer 34 can comprise a photoimageable dielectric material, such as a negative or positive tone resist. A representative thickness of the mask layer 34 can be from 10 μm to 100 μm. One suitable resist is commercially available from Taiyo America, Inc., Carson City, Nev., under the trademark "PSR-4000". The "PSR-4000" resist can be mixed with an epoxy such as epoxy "720" manufactured by Ciba-Geigy (e.g., 80% PSR-4000 and 20% epoxy "720"). Another suitable resist is commercially available from Shipley under the trademark "XP-9500". The mask layer 34 can also comprise a photoimageable polyimide, or a thick film resist such as "EPON RESIN SU-8" sold by Shell Chemical.

The metallization layer 36 can initially comprise a sheet of material, such as copper, that provides a support substrate for exposing and developing the mask layer 34. Following exposure and development of the mask layer 34, the metallization layer 36 can be patterned, such as by etching through a mask to define the conductors 40, the interconnect contacts 42 and the terminal contact contacts 20. In addition, the interconnect contacts 42, and the terminal contact contacts 20, can be plated with a metal such as Au, Ni, Pd and alloys of these metals, to provide a non-oxidizing bondable metallurgy.

Figure 5:
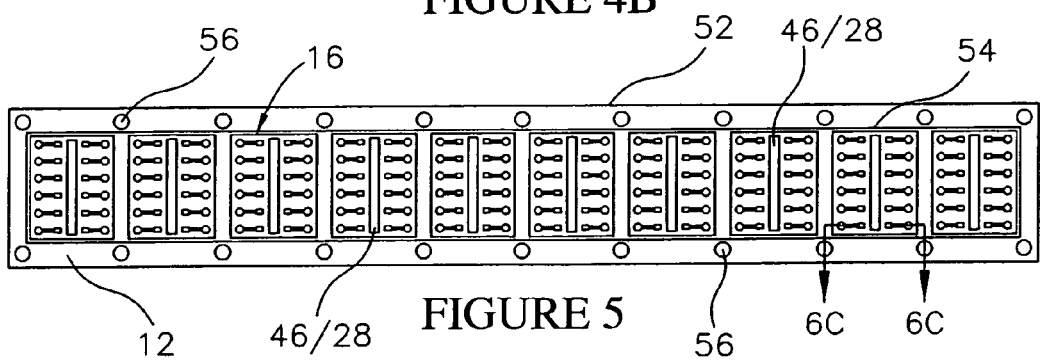
FIG. 5 is an enlarged schematic plan view of the decal strip attached to the stiffener strip for fabricating multiple components.

As shown in FIG. 5, the decal strip 54 can be attached to the stiffener strip 52 to complete the stiffeners 12. Alternately, rather than being contained on a strip, the circuit decals 16 can comprise singulated elements that are individually attached to the stiffener strip. Also, the circuit decals 16 can initially include a support layer (not shown), such as a layer of paper or tape, which can be used to facilitate attachment to the stiffener strip 52. With the circuit decals 16 attached to the stiffener strip 52, each stiffener 12 includes a circuit decal 16 which comprises a pattern of conductors 40 and an associated mask layer 34 having terminal contact openings 50 and interconnect openings 48. Each stiffener 12 also includes an adhesive layer 32 in physical contact with the conductors 40, configured to attach the circuit decal 16 to the stiffener 12, and to electrically insulate the conductors 40 from the stiffener 12.

Figure 6A:
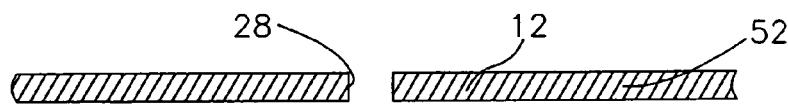
FIG. 6A is an enlarged schematic cross sectional view of a stiffener on the stiffener strip during the fabrication method, taken along line 6A-6A of FIG. 3.

Referring to FIGS. 6A-6G, steps in a method for fabricating the semiconductor component 10 are illustrated in schematic cross sectional views. Initially, as shown in FIG. 6A, the stiffener 12 can be provided on the stiffener strip 52, substantially as previously described and shown in FIG. 3.

Figure 6B:
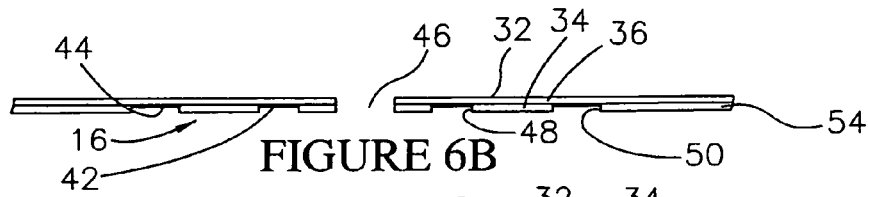
FIG. 6B is an enlarged schematic cross sectional view of a circuit decal on the decal strip during the fabrication method, taken along line 6B-6B of FIG. 4A.

As shown in FIG. 6B, the circuit decal 16 can be provided on the decal strip 54, substantially as previously described and shown in FIGS. 4A-4B. Alternately, rather than being contained on a strip, the circuit decal 16 can be a singulated element.

Figure 6C:
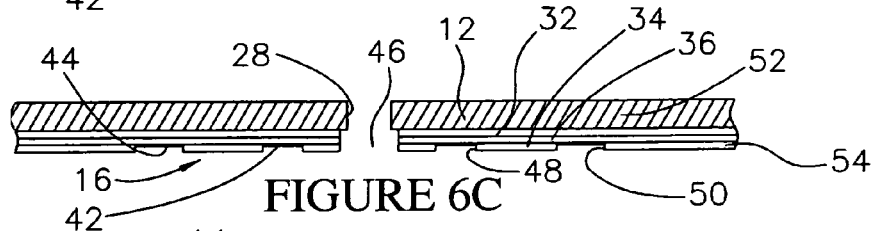
FIG. 6C is an enlarged schematic cross sectional view of a circuit decal attached to a stiffener during the fabrication method, taken along line 6C-6C of FIG. 5.

Next, as shown in FIG. 6C, the decal strip 54 containing the circuit decals 16 can be attached to the stiffener strip 52, substantially as previously described and shown in FIG. 5. Alternately, the circuit decals 16 can be singulated elements attached to the stiffener strip 52. In either case, the adhesive layer 32 attaches the circuit decals 16 to the stiffener strip 52 with the conductors 40 on the circuit decals 16 in physical contact with the adhesive layer 32. In addition, the adhesive layer 32 electrically insulates the conductors 40 on the circuit decals 16 from the stiffeners 12. The adhesive layer 32 can comprise an electrically insulating polymer, such as a curable epoxy, acrylic, or polyimide material. Alternately, the adhesive layer 32 can comprise a polymer tape material having an adhesive material on one or both sides. Further, the adhesive layer 32 can be formed using techniques that are known in the art, such as spray coating or taping, followed by curing in an oven or with UV.

Figure 6D:
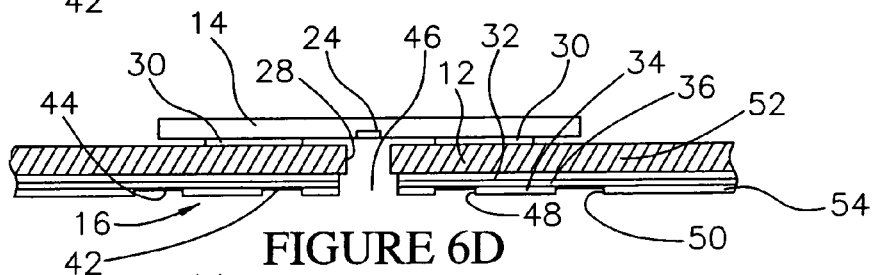
FIG. 6D is an enlarged schematic cross sectional view illustrating a die attaching step of the fabrication method.

Next, as shown in FIG. 6D, the dice 14 are attached to the stiffener strip 52 with each die 14 in a board on chip configuration. The die attach step can be performed by placing the adhesive members 30 on the circuit sides 26 of the dice 14, and then placing the dice 14 on the surface 58 of the stiffener strip 52. Alternately, the adhesive members 30 can be placed on the surface 58 of the stiffener strip 52, and then the dice 14 placed on the adhesive members 30. The die attach step can be performed using a conventional die attach apparatus configured to apply the adhesive members 30 to the dice 14 (or to the stiffeners 12), and then to press the dice 14 against the stiffeners 12. The adhesive members 30 can comprise a curable polymer material as previously described, or strips of polymer tape covered with an adhesive material, also as previously described. During the die attach step, the dice 14 are aligned on the stiffener strip 52, such that the wire bonding openings 46 on the stiffeners 12 align with the die contacts 24 on the dice 14. In addition, the metallization layers 36 on the circuit decals 16 face the circuit sides 26 of the dice 14, while the mask layers 34 on the circuit decals 16 face away from the dice 14. Further, the mask layers 34 form exposed exterior surfaces for the components 10, and cover and protect the conductors 40 as well.

Figure 6E:
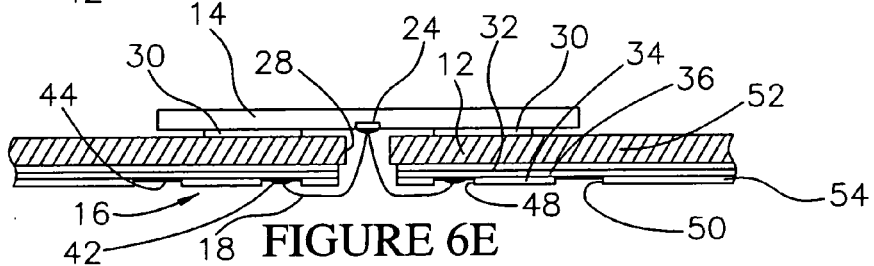
FIG. 6E is an enlarged schematic cross sectional view illustrating a wire bonding step of the fabrication method.

Next, as shown in FIG. 6E, a bonding step is performed in which the wire interconnects 18 are bonded to the die contacts 24 on the dice 14, and to the interconnect contacts 42 on the circuit decals 16. In the illustrative embodiment, the wire interconnects 18 comprise metal wires formed of a material such as Au, Al, or alloys thereof, such as AlMG or AuSi. With the wire interconnects 18 comprising metal wires, the bonding step can be performed using a conventional wire bonder apparatus, configured to wire bond the wire interconnects 18 to the die contacts 24, and to the interconnect contacts 42. The interconnect contacts 42 can comprise pads which include one or more metal layers including a bondable outer layer, such as Au, Ni, Pd and alloys thereof, configured to facilitate the wire bonding process. In addition, the wire interconnects 18 are placed through the wire bonding openings 28 on the stiffeners 12 and through the wire bonding openings 46 on the circuit decals 16.

Rather than wire interconnects 18 formed by wire bonding, tape automated bonding (TAB) interconnects can be used, and TAB bonding techniques such as thermode bonding, or gang bonding can be employed to bond TAB interconnects to the die contacts 24 and to the interconnect contacts 42. In this case, the TAB interconnects can be contained on a multi-layered tape, such as TAB tape, or "ASMAT" manufactured by Nitto Denko of Japan.

Figure 6F:
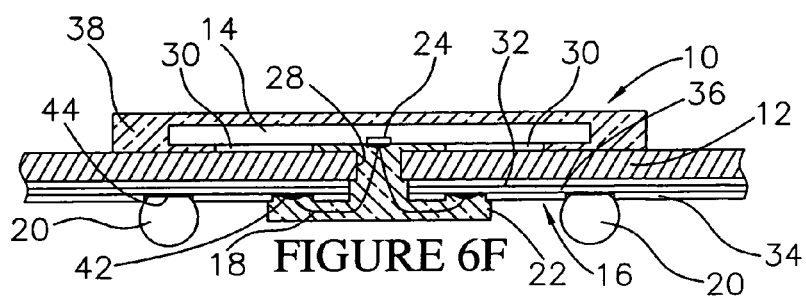
FIG. 6F is an enlarged schematic cross sectional view illustrating an encapsulating step of the fabrication method.

Next, as shown in FIG. 6F, an encapsulating step is performed in which the die encapsulants 38 for the components 10 are formed on the stiffener strip 52. The die encapsulants 38 function to protect and seal the dice 14 on the stiffeners 12. The encapsulants 38 also form bodies of the components 10, and make up the bulk of the components 10. Further, each encapsulant 38 has a generally square shape when viewed from above, and a thickness that is only slightly greater than the thickness of the associated die 14 and stiffener 12 combined. Still further, each encapsulant 38 has a peripheral outline matching that of the stiffener 12, and this outline determines the peripheral outline, or footprint, of the component 10. The peripheral outline of each encapsulant 38 can be slightly larger than that of the die 14 (e.g., 1.25×), such that the component 10 can be considered a chip scale component.

The encapsulants 38 can comprise a polymer material such as an epoxy, a silicone, a polyimide or a transfer molded underfill compound (MUF). In addition, these polymer materials can include fillers such as silicates configured to reduce the coefficient of thermal expansion (CTE) and adjust the viscosity of the polymer material. One method for forming the encapsulants 38 comprises transfer molding using a transfer molding apparatus. The encapsulants 38 can also be formed by a deposition process, such as dispensing through a nozzle.

As also shown in FIG. 6F, the interconnect encapsulants 22 can also be formed using a suitable molding or deposition process. By way of example, the interconnect encapsulants 22 can be deposited in a viscous state in the manner of a "glob top", using a conventional deposition apparatus, such as a material dispensing system having a computer controlled nozzle. One suitable system is manufactured by Asymtek of Carlsbad, Calif. Following deposition, the interconnect encapsulants 22 can be cured, and if required, shaped or planarized using a grinder or other suitable apparatus.

As also shown in FIG. 6F, a terminal contact forming step is performed in which the terminal contacts 20 are formed on the terminal contact contacts 44 on the circuit decals 16. The terminal contact contacts 44 can comprise pads formed of a bondable metal such as Al, Cu, Au and alloys thereof, to facilitate forming or bonding of the terminal contacts 20. In addition, the terminal contact contacts 44 are formed on the second opposing sides of the stiffeners 12, which is opposite to the first side thereof attached to the dice 14.

The terminal contact forming step can be performed by bonding, or depositing, the terminal contacts 20 on the terminal contact contacts 44. For example, the terminal contacts 20 can comprise metal bumps deposited using a suitable deposition process, such as stenciling and reflow of a solder alloy. In this case, the mask layer 34 and the terminal contact openings 50 facilitate deposition, and prevent bridging and shorting between the terminal contacts 20. The terminal contacts 20 can also be formed by electrolytic deposition, by electroless deposition, or by bonding prefabricated balls to the terminal contact contacts 44. Also, rather than being formed of metal, the terminal contacts 20 can comprise a conductive polymer material. Still further, the terminal contacts 20 can comprise metal, or metal plated pins.

Figure 6G:
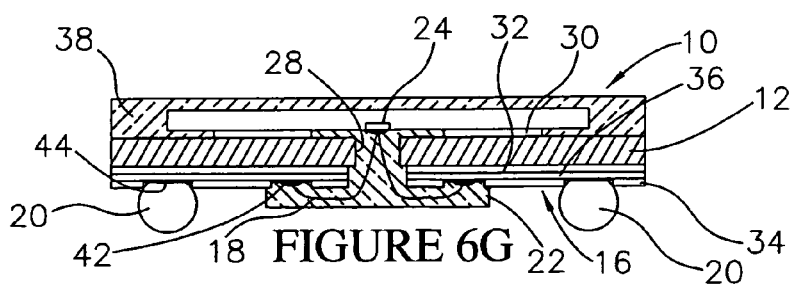
FIG. 6G is an enlarged schematic cross sectional view illustrating a singulating step of the fabrication method.

Next, as shown in FIG. 6G, a singulating step is performed in which the stiffener strip 52 and the decal strip 54 are trimmed to separate the individual components 10, such that each component 10 comprises a discrete element comprising a stiffener 12, a die 14 and a circuit decal 16. The singulating step can be performed using a suitable apparatus such as a saw or a shear.

Referring to FIGS. 7A and 7B, a multi chip module system 60 that includes multiple components 10, 10A, 10B or 10C is illustrated. The multi chip module system 60 can be configured for performing a specific function, such as memory storage. The multi chip module system 60 includes a module substrate 62 having patterns of electrodes 64 (FIG. 7B) configured for bonding the components 10, 10A, 10B or 10C to the module substrate 62. For example, the terminal contacts 20 on the components 10, 10A, 10B or 10C can be bonded to the electrodes 64 on the module substrate 62 using a suitable bonding process, such as solder reflow, thermode bonding or conductive polymer bonding. The electrodes 64 are in electrical communication with conductors 66 formed on the module substrate 62 in a required circuit pattern. In addition, the conductors 66 are in electrical communication with an edge connector 68 which provides connection points from the outside to the multi chip module system 60.

Referring to FIG. 8, a computer system 70 includes one or more components 10, 10A, 10B or 10C, which can be mounted to the computer system 70 in a suitable manner. In addition, the components 10, 10A, 10B or 10C can be configured to perform a desired function in the computer system 70 such as memory, storage or micro processing.

Referring to FIG. 9, a digital camcorder system 72 includes one or more components 10, 10A, 10B or 10C, which can be mounted in a suitable manner, and configured to perform a desired circuit function in the camcorder system 72.

Referring to FIG. 10, a camera system 74 includes one or more components 10, 10A, 10B or 10C, which can be mounted in a suitable manner, and configured to perform a desired circuit function in the camera system 74.

Referring to FIG. 11, a cellular phone system 76 includes one or more components 10, 10A, 10B or 10C, which can be mounted to in a suitable manner, and configured to perform a desired circuit function in the cellular phone system 76.

Thus the invention provides an improved semiconductor component, a method for fabricating the component, and systems incorporating the component. While the invention has been described with reference to certain preferred embodiments, as will be apparent to those skilled in the art, certain changes and modifications can be made without departing from the scope of the invention as defined by the following claims.

What is claimed is:

1. A method for fabricating a semiconductor component comprising:
providing a metal stiffener;
providing a circuit decal comprising a plurality of conductors and a polymer mask on the conductors;
attaching the circuit decal to the stiffener by forming an adhesive layer in physical contact with the stiffener and the conductors;
attaching a semiconductor die to the stiffener in electrical communication with the conductors; and
forming a plurality of terminal contacts on the conductors electrically isolated by the polymer mask.

2. The method of claim 1 wherein the attaching the semiconductor die step comprises adhesively bonding the die to the stiffener and wire bonding the die to the conductors.

3. The method of claim 1 further comprising encapsulating the die.

4. The method of claim 1 further comprising providing the conductors with a plurality of contacts in an area array for forming the terminal contacts.

5. The method of claim 1 wherein the stiffener comprises a metal selected from the group consisting of stainless steel, copper, nickel, titanium, aluminum, and alloys of these metals.

6. The method of claim 1 wherein the polymer mask comprises a photoimageable polymer having a plurality of openings for the terminal contacts.

7. The method of claim 1 wherein the providing the stiffener step comprises providing a metal strip containing the stiffener and a plurality of stiffeners.

8. The method of claim 1 wherein the providing the circuit decal step comprises providing a decal strip containing the circuit decal and a plurality of circuit decals.

9. A method for fabricating a semiconductor component comprising:
providing a stiffener comprising a metal plate, a circuit decal attached to the metal plate comprising a plurality of conductors having contacts in an area array and a polymer mask on the conductors, and an electrically insulating adhesive layer in physical contact with the metal plate and the conductors;
attaching a semiconductor die to the stiffener in electrical communication with the conductors; and
forming a plurality of terminal contacts on the contacts using the polymer mask.

10. The method of claim 9 wherein the attaching the die step comprises bonding a circuit side of the die to the stiffener and wire bonding the die to the conductors.

11. The method of claim 9 wherein the forming the terminal contacts step comprising depositing solder bumps on the contacts.

12. The method of claim 9 wherein the forming the terminal contacts step comprising bonding solder balls to the contacts.

13. The method of claim 9 wherein the stiffener is contained on a strip comprising a plurality of stiffeners.

14. The method of claim 9 wherein the circuit decal is contained on a strip comprising a plurality of circuit decals.

15. The method of claim 9 wherein the component comprises a ball grid array package.

16. The method of claim 9 wherein the component comprises a multi chip module.

17. A method for fabricating a semiconductor component comprising:
providing a metal strip comprising a plurality of stiffeners;
providing a decal strip comprising a plurality of circuit decals, each circuit decal comprising a plurality of conductors having contacts in an area array, and a solder mask on the conductors having a plurality of openings aligned with the contacts;
forming an electrically insulating adhesive layer between the metal strip and the decal strip in physical contact with the conductors;
attaching a plurality of dice to the metal strip in electrical communication with the conductors;
forming a plurality of terminal contacts in the openings on the contacts; and singulating a stiffener, a circuit decal and a die from the metal strip.

18. The method of claim 17 wherein the attaching the plurality of dice step is performed by adhesively bonding circuit sides of the dice to the metal strip in a board on chip configuration.

19. The method of claim 17 wherein the forming the terminal contacts step comprises forming solder bumps or balls in the openings.

20. The method of claim 17 wherein the forming the terminal contacts step comprises bonding solder balls to the contacts.

21. The method of claim 17 further comprising encapsulating the dice on the metal strip.

22. The method of claim 17 wherein the attaching the dice step comprises wire bonding.

23. The method of claim 17 wherein the conductors comprise a plurality of interconnect contacts for wire bonding to the dice.

24. A method for fabricating a semiconductor component comprising:
providing a metal stiffener;
providing a circuit decal comprising a metallization layer and an outer polymer layer;
forming an electrically insulating adhesive layer between the metallization layer and the metal stiffener;
attaching a semiconductor die to the stiffener;
forming a plurality of interconnects between the die and the metallization layer; and forming a plurality of terminal contacts on the metallization layer.

25. The method of claim 24 further comprising encapsulating the die.

26. The method of claim 24 wherein the forming the interconnects step comprises wire bonding.

27. The method of claim 24 wherein the metallization layer comprises copper.

28. The method of claim 24 wherein the metallization layer comprises a plurality of contacts for the terminal contacts in an area array.

29. The method of claim 24 wherein the terminal contacts comprise solder bumps or balls and the outer polymer layer comprises a solder mask.

30. The method of claim 24 wherein the providing the metal stiffener step comprises providing a metal strip containing a plurality of stiffeners.

31. The method of claim 24 wherein the providing the circuit decal step comprises providing a decal strip containing a plurality of circuit decals.

32. The method of claim 24 wherein the attaching the die to the stiffener step comprises adhesively bonding a circuit side of the die to the stiffener.

* * * * *